(12) United States Patent
Nielsen et al.

(10) Patent No.: US 8,138,828 B2  
(45) Date of Patent: Mar. 20, 2012

(54) ACTIVE MUTE SCHEME FOR AN AMPLIFIER

(75) Inventors: Allan N. Nielsen, Dallas, TX (US); Kim N. Madsen, Skovlunde (DK)

(73) Assignee: Texas Instruments Incorporated, Dallas, TX (US)

( * ) Notice: Subject to any disclaimer, the term of this patent is extended or adjusted under 35 U.S.C. 154(b) by 101 days.

(21) Appl. No.: 12/750,431

(22) Filed: Mar. 30, 2010

(65) Prior Publication Data

US 2011/0241771 A1    Oct. 6, 2011

(51) Int. Cl.  
*H03F 1/14* (2006.01)

(52) U.S. Cl. .......................................................... 330/51

(58) Field of Classification Search ............... 330/9, 51; 381/94.5  
See application file for complete search history.

(56) References Cited

U.S. PATENT DOCUMENTS

| | | | |
|---|---|---|---|
| 5,166,983 A | 11/1992 | Susak | |
| 7,102,400 B1 | 9/2006 | Mulders | |
| 7,102,414 B2 | 9/2006 | Lin | |
| 7,463,742 B2 * | 12/2008 | Inagaki | 381/94.5 |
| 2007/0009110 A1 | 1/2007 | Kakumoto et al. | |
| 2008/0137882 A1 | 6/2008 | Tsai et al. | |

FOREIGN PATENT DOCUMENTS

| | | |
|---|---|---|
| EP | 0 095 774 A2 | 12/1983 |
| EP | 0482290 A2 | 4/1992 |

* cited by examiner

*Primary Examiner* — Steven J Mottola  
(74) *Attorney, Agent, or Firm* — Alan A. R. Cooper; John J. Patti; Frederick J. Telecky, Jr.

(57) ABSTRACT

Conventional muting circuitry for amplifiers (which usually uses clamps) generally has about 20-30 dB of attenuation. Here, an integrated circuit or IC is provided that includes an amplifier, switch networks, and a controller. The controller provides control signals to the switch network to provide mute functionality by actively muting the amplifier. In particular, feedback is provided through at least one of the switch networks to drive the output of the amplifier to null or ground so as to provide 70-80 dB (or more) of attenuation.

20 Claims, 2 Drawing Sheets

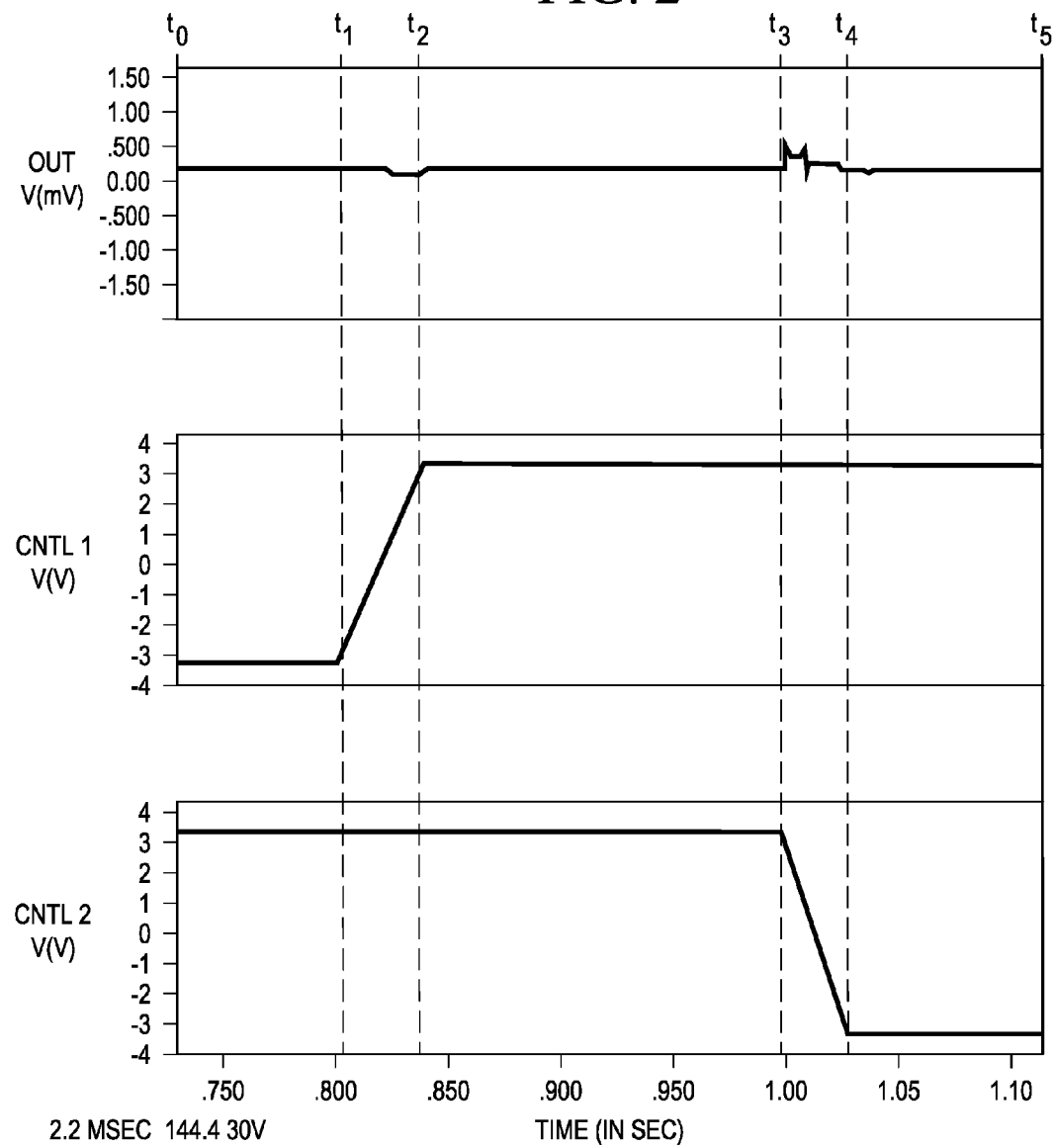

ACTIVE MUTE SCHEME FOR AN AMPLIFIER

TECHNICAL FIELD

The invention relates generally to an amplifier and, more particularly, to an active mute scheme for an amplifier.

BACKGROUND

Muting circuitry is commonly employed with audio and other amplifiers. Typically, clamps are employed (either on the input or output terminals of the amplifier) to provide this function. These conventional muting circuits, however, usually only provide about 20-30 dB of attenuation. So there is a need for muting circuitry with greater attenuation. Some examples of conventional circuits are: U.S. Pat. No. 5,166,983; U.S. Pat. No. 7,102,400; and U.S. Pat. No. 7,102,414.

SUMMARY

A preferred embodiment of the present invention, accordingly, provides an apparatus is provided. The apparatus comprises a first pin; a second pin; a third pin; an amplifier having a first input terminal, a second input terminal, and an output terminal, wherein the output terminal of the amplifier is coupled to the third pin; a first switch network that is coupled between the first pin and the first input terminal of the amplifier and that is coupled between the second pin and the second input terminal of the amplifier; a second switch network that is coupled to the first input terminal of the amplifier, the second input terminal of the amplifier, and the output terminal of the amplifier; and a controller that is coupled to provide a first control signal to the first switch network and that is coupled to provide a second control signal to the second switch network, wherein the first control signal activates each switch in the first switch network during an amplify mode and a transition mode, and wherein the second control signal activates each switch in the second switch network during a mute mode and the transition mode, and wherein feedback through the amplifier during the mute mode actively mutes the amplifier.

In accordance with a preferred embodiment of the present invention, the amplifier further comprises a class AB audio amplifier.

In accordance with a preferred embodiment of the present invention, first switch network further comprises: a first switch that is coupled between the first pin and the first input terminal of the amplifier, wherein the first switch is controlled by the first control signal; and a second switch that is coupled between the second pin and the second input terminal of the amplifier, wherein the second switch is controlled by the first control signal.

In accordance with a preferred embodiment of the present invention, the first and second switches further comprise MOSFET switches.

In accordance with a preferred embodiment of the present invention, rise and fall times for the first control signal are about 30 µs.

In accordance with a preferred embodiment of the present invention, the second switch network further comprises: a first switch that is coupled between the output terminal of the amplifier and the first input terminal of the amplifier, wherein the first switch is controlled by the second control signal; and a second switch that is coupled between the second input terminal of the amplifier and ground, wherein the second switch is controlled by the second control signal.

In accordance with a preferred embodiment of the present invention, the second switch network further comprises a resistor that is coupled between the first switch and the first input terminal of the amplifier.

In accordance with a preferred embodiment of the present invention, the resistor further comprises a first resistor, and wherein the second switch network further comprises: a third switch that is coupled to the first input terminal of the amplifier, wherein the third switch is controlled by the second control signal; and a second resistor that is coupled between the third switch and ground.

In accordance with a preferred embodiment of the present invention, the first and second resistor each have a resistance of about 10 kΩ.

In accordance with a preferred embodiment of the present invention, the first, second, and third switches further comprise MOSFET switches.

In accordance with a preferred embodiment of the present invention, rise and fall times for the second control signal are about 30 µs.

In accordance with a preferred embodiment of the present invention, the length of the transition mode is at least about 100 µs.

In accordance with a preferred embodiment of the present invention, an apparatus is provided. The apparatus comprises a first pin; a second pin; a third pin; an amplifier having a first input terminal, a second input terminal, and an output terminal, wherein the output terminal of the amplifier is coupled to the third pin; a first switch network having: a first switch that is coupled between the first pin and the first input terminal of the amplifier; and a second switch that is coupled between the second pin and the second input terminal of the amplifier; a second switch network having: a third switch that is coupled to the output terminal of the amplifier; a fourth switch that is coupled between the second input terminal of the amplifier and ground; a first resistor that is coupled between the first switch and the first input terminal of the amplifier; a fifth switch that is coupled to the first input terminal of the amplifier; and a second resistor that is coupled between the third switch and ground; and a controller that is coupled to provide a first control signal to the first and second switches and that is coupled to provide a second control signal to the third, fourth, and fifth switches, wherein the first control signal activates each of the first and second switches switch in the first switch network during an amplify mode and a transition mode, and wherein the second control signal activates each of the third, fourth, and fifth switches in the second switch network during a mute mode and the transition mode, and wherein feedback through the amplifier during the mute mode actively mutes the amplifier.

In accordance with a preferred embodiment of the present invention, a method is provided. The method comprises activating a plurality of switches in a first switch network with a first control signal during an active mode so as to amplify a signal from a signal source with an amplifier; activating a plurality of switches in a second switch network with a second control signal during a transition mode to retain closed loop operation of the amplifier; and deactivating the plurality of switches in the first switch network with the first control signal during a mute mode so that feedback through the amplifier actively mutes the amplifier, wherein the mute mode follows the transition mode.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a timing diagram for the control signals of the circuit of FIG. 1.

DETAILED DESCRIPTION

Figure 1:
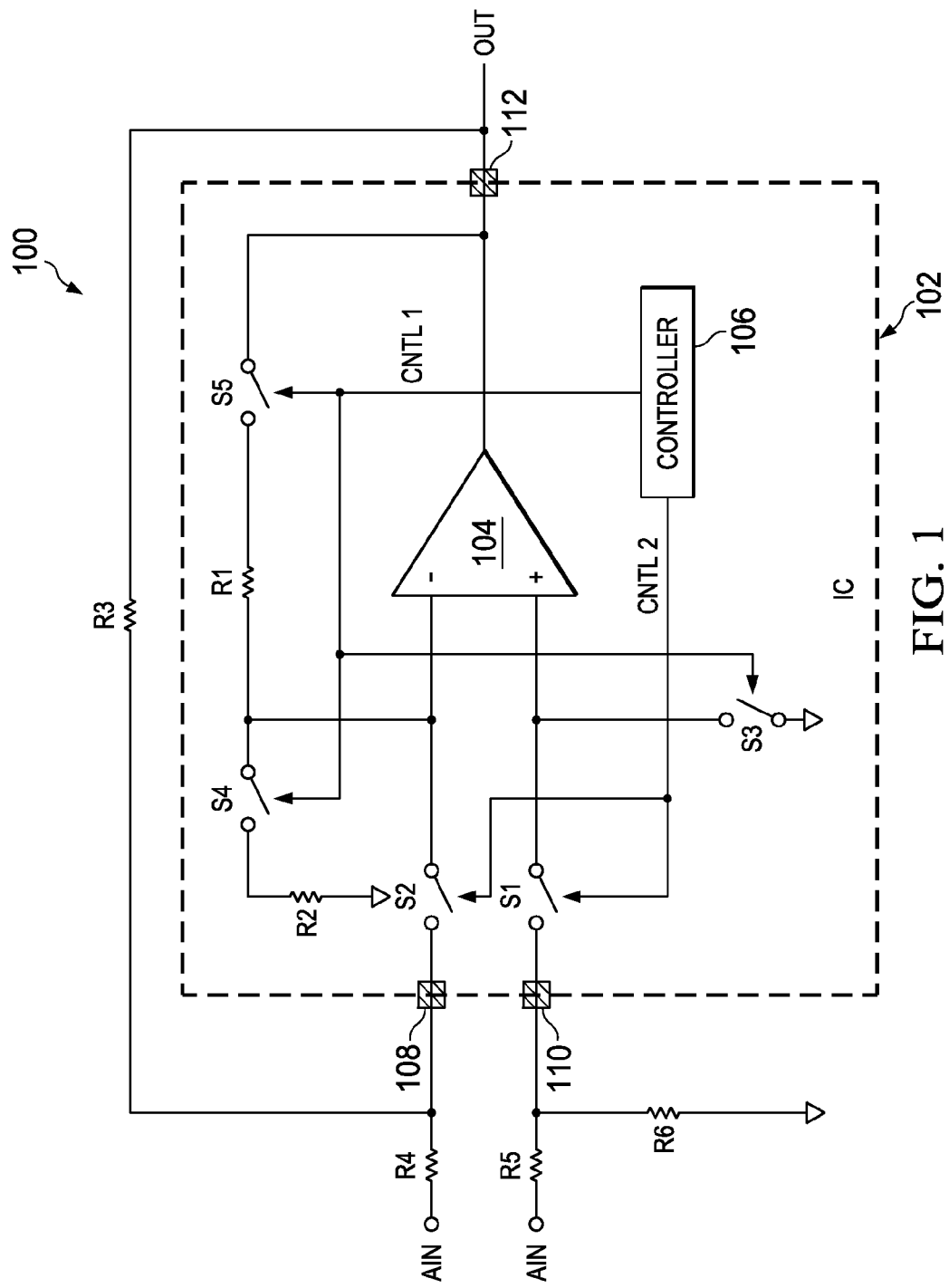
FIG. 1 is a block diagram of an example of a circuit in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates a circuit in accordance with a preferred embodiment of the present invention. Circuit 100 generally comprises an integrated circuit (IC) 102 and resistors R3, R4, R5, and R6. Resistors R3, R4, R5, and R6 are coupled to pins 108, 110, and 112 of IC 102 in order to amplify input signal AIN so as generate output signal OUT. IC 102 generally comprises switch networks, amplifier 104 (which is typically a class AB audio amplifier), and controller 106.

Operationally, IC 102 generally operates the amplifier 104 in three modes: active mode, transition mode, and mute mode. Each of these modes can be seen in FIG. 2. During the active mode (which is shown between times t0 and t1 of FIG. 2), control signal CNTL2 is asserted by controller 106 so that switches S1 and S2 (of one of the switch networks) are activated. When switches S1 and S2 are activated, the amplifier 104 normally amplifies the input signal AIN. During the transition mode (which is shown between times t1 and t4 of FIG. 2), control signals CNTL1 and CNTL2 are both asserted by controller 106 to activate switches S1 through S5 (of all of the switch networks). The transition mode (which is generally at least about 100 μs in length) is provided to maintain closed loop operation of amplifier 104; without the transition mode, the amplifier 104 would generate audible artifacts (for audio applications) associated with open loop operation. Finally, in mute mode, control signal CNTL1 is asserted to activate switches S3, S4, and S5 (of one of the switch networks). Switches S3, S4, and S5 enable the positive input terminal of amplifier 104 to be grounded while feedback from the output terminal of amplifier 104 can be provided through resistors R1 and R2 (which are each generally about 10 kΩ) to the negative input terminal of amplifier 104. This feedback actively mutes the amplifier 104 by driving the output signal OUT to null or ground with an attenuation of about 70-80 dB or higher.

Looking specifically to switches S1 through S5, each switch S1 through S5 is generally a MOSFET switch. This means that charge injection from these switches S1 through S5 should be considered for the relative sizes of switches S1 through S5 and rise/fall times of control signals CNTL1 and CNTL2. Typically, the rise and fall times for control signals CNTL1 and CNTL2 (as shown between times t1 to t2 and times t3 to t4 in FIG. 2) are about 30 μs. Additionally, dummy switches can be employed for switch injection cancellation.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising;
   a first pin;
   a second pin;
   a third pin;
   an amplifier having a first input terminal, a second input terminal, and an output terminal, wherein the output terminal of the amplifier is coupled to the third pin;
   a first switch network that is coupled between the first pin and the first input terminal of the amplifier and that is coupled between the second pin and the second input terminal of the amplifier;
   a second switch network that is coupled to the first input terminal of the amplifier, the second input terminal of the amplifier, and the output terminal of the amplifier; and
   a controller that is coupled to provide a first control signal to the first switch network and that is coupled to provide a second control signal to the second switch network, wherein the first control signal activates each switch in the first switch network during an amplify mode and a transition mode, and wherein the second control signal activates each switch in the second switch network during a mute mode and the transition mode, and wherein feedback through the amplifier during the mute mode actively mutes the amplifier.

2. The apparatus of claim 1, wherein the amplifier further comprises a class AB audio amplifier.

3. The apparatus of claim 1, wherein first switch network further comprises:
   a first switch that is coupled between the first pin and the first input terminal of the amplifier, wherein the first switch is controlled by the first control signal; and
   a second switch that is coupled between the second pin and the second input terminal of the amplifier, wherein the second switch is controlled by the first control signal.

4. The apparatus of claim 3, wherein the first and second switches further comprise MOSFET switches.

5. The apparatus of claim 4, wherein rise and fall times for the first control signal are about 30 μs.

6. The apparatus of claim 1, wherein the second switch network further comprises:
   a first switch that is coupled between the output terminal of the amplifier and the first input terminal of the amplifier, wherein the first switch is controlled by the second control signal; and
   a second switch that is coupled between the second input terminal of the amplifier and ground, wherein the second switch is controlled by the second control signal.

7. The apparatus of claim 6, wherein the second switch network further comprises a resistor that is coupled between the first switch and the first input terminal of the amplifier.

8. The apparatus of claim 7, wherein the resistor further comprises a first resistor, and wherein the second switch network further comprises:
- a third switch that is coupled to the first input terminal of the amplifier, wherein the third switch is controlled by the second control signal; and
- a second resistor that is coupled between the third switch and ground.

9. The apparatus of claim 8, wherein the first and second resistor each have a resistance of about 10 kΩ.

10. The apparatus of claim 8, wherein the first, second, and third switches further comprise MOSFET switches.

11. The apparatus of claim 4, wherein rise and fall times for the second control signal are about 30 µs.

12. The apparatus of claim 1, wherein the length of the transition mode is at least about 100 µs.

13. An apparatus comprising:
- a first pin;
- a second pin;
- a third pin;
- an amplifier having a first input terminal, a second input terminal, and an output terminal, wherein the output terminal of the amplifier is coupled to the third pin;
- a first switch network having:
  - a first switch that is coupled between the first pin and the first input terminal of the amplifier; and
  - a second switch that is coupled between the second pin and the second input terminal of the amplifier;
- a second switch network having:
  - a third switch that is coupled to the output terminal of the amplifier;
  - a fourth switch that is coupled between the second input terminal of the amplifier and ground;
  - a first resistor that is coupled between the first switch and the first input terminal of the amplifier;
  - a fifth switch that is coupled to the first input terminal of the amplifier; and
  - a second resistor that is coupled between the third switch and ground; and
- a controller that is coupled to provide a first control signal to the first and second switches and that is coupled to provide a second control signal to the third, fourth, and fifth switches, wherein the first control signal activates each of the first and second switches switch in the first switch network during an amplify mode and a transition mode, and wherein the second control signal activates each of the third, fourth, and fifth switches in the second switch network during a mute mode and the transition mode, and wherein feedback through the amplifier during the mute mode actively mutes the amplifier.

14. The apparatus of claim 13, wherein the amplifier further comprises a class AB audio amplifier.

15. The apparatus of claim 13, wherein the first and second resistor each have a resistance of about 10 kΩ.

16. The apparatus of claim 13, wherein the first, second, third, fourth, and fifth switches further comprise MOSFET switches.

17. The apparatus of claim 13, wherein rise and fall times for the first and second control signals are about 30 µs.

18. The apparatus of claim 13, wherein the length of the transition mode is at least about 100 µs.

19. A method comprising:
- activating a plurality of switches in a first switch network with a first control signal during an active mode so as to amplify a signal from a signal source with an amplifier, wherein the first switch network is coupled between a first pin and a first input terminal of the amplifier, the amplifier further including a second input terminal and an output terminal, wherein the output terminal of the amplifier is coupled to a third pin, wherein the first switch network is also coupled between a second pin and the second input terminal of the amplifier;
- activating a plurality of switches in a second switch network with a second control signal during a transition mode to retain closed loop operation of the amplifier, wherein said second switch network is coupled to the first input terminal of the amplifier, the second input terminal of the amplifier, and the output terminal of the amplifier; and
- deactivating the plurality of switches in the first switch network with the first control signal during a mute mode so that feedback through the amplifier actively mutes the amplifier, wherein the mute mode follows the transition mode,
- wherein the first control signal activates each switch in the first switch network during an amplify mode and a transition mode, and wherein the second control signal activates each switch in the second switch network during the mute mode and the transition mode.

20. The method of claim 19, wherein the rise and fall times of the first and second control signal are about 30 µs, and wherein the length of the transition mode is about 100 µs.

* * * * *